(12) United States Patent
Derderian et al.

(10) Patent No.: US 6,429,127 B1
(45) Date of Patent: Aug. 6, 2002

(54) METHODS FOR FORMING ROUGH RUTHENIUM-CONTAINING LAYERS AND STRUCTURES/METHODS USING SAME

(75) Inventors: Garo Derderian; Vishnu K. Agarwal, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/589,849

(22) Filed: Jun. 8, 2000

(51) Int. Cl.[7] .............................................. H01L 21/44
(52) U.S. Cl. ....................................... 438/686; 438/758
(58) Field of Search ................................ 438/260, 681, 438/686, 758, 778, 781, 238, 396, 627, 643, 653; 257/309, 751, 757, 768, 774

(56) References Cited

U.S. PATENT DOCUMENTS

| | | | |
|---|---|---|---|
| 5,068,199 A | 11/1991 | Sandhu | 437/52 |
| 5,130,172 A | 7/1992 | Hicks et al. | 427/54.1 |
| 5,130,885 A | 7/1992 | Fazan et al. | 361/313 |
| 5,314,727 A | 5/1994 | McCormick et al. | 427/255.3 |
| 5,318,920 A | 6/1994 | Hayashide | 437/47 |
| 5,342,800 A | 8/1994 | Jun | 437/52 |
| 5,352,488 A | 10/1994 | Spencer et al. | 427/250 |
| 5,372,849 A | 12/1994 | McCormick et al. | 427/253 |
| 5,372,962 A | 12/1994 | Hirota et al. | 437/47 |
| 5,392,189 A | 2/1995 | Fazan et al. | 361/305 |
| 5,427,974 A | 6/1995 | Lur et al. | 437/60 |
| 5,510,651 A | 4/1996 | Maniar et al. | 257/751 |
| 5,520,992 A | 5/1996 | Douglas et al. | 428/209 |
| 5,555,486 A | 9/1996 | Kingon et al. | 361/305 |
| 5,561,307 A | 10/1996 | Mihara et al. | 257/295 |
| 5,566,045 A | 10/1996 | Summerfelt et al. | 361/321.1 |
| 5,581,436 A | 12/1996 | Summerfelt et al. | 361/321.1 |
| 5,608,247 A | 3/1997 | Brown | 257/306 |
| 5,612,560 A | 3/1997 | Chivukula et al. | 257/309 |
| 5,696,014 A | 12/1997 | Figura | 437/52 |
| 5,763,633 A | 6/1998 | Vaartstra | 556/136 |
| 5,874,364 A | 2/1999 | Nakabayashi et al. | 438/738 |
| 5,877,063 A | 3/1999 | Gilchrist | 438/398 |

(List continued on next page.)

FOREIGN PATENT DOCUMENTS

| | | |
|---|---|---|
| JP | 10163131 | 6/1998 |
| WO | WO 0022658 A | 6/2000 |

OTHER PUBLICATIONS

Kawahara, Takaaki et al., "(Ba, Sr)TiO$_3$ Films Prepared by Liquid Source Chemical Vapor Deposition on Ru Electrodes," *Jpn. J. Appl. Phys.*, 35: 4880–4885 (1996).

(List continued on next page.)

*Primary Examiner*—David Nelms
*Assistant Examiner*—Phuc T. Dang
(74) *Attorney, Agent, or Firm*—Mueting, Raasch & Gebhardt, P.A.

(57) ABSTRACT

A method for forming a rough ruthenium-containing layer on the surface of a substrate assembly includes providing a ruthenium-containing precursor into the reaction chamber. A rough ruthenium layer may be deposited on the surface of the substrate assembly at a rate of about 100 Å/minute to about 500 Å/minute using the ruthenium-containing precursor. Further, a rough ruthenium oxide layer may be formed by providing a ruthenium-containing precursor and an oxygen-containing precursor into the reaction chamber to deposit the rough ruthenium oxide layer on the surface of the substrate assembly at a rate of about 100 Å/minute to about 1200 Å/minute. An anneal of the layers may be performed to further increase the roughness. In addition, conductive structures including a rough ruthenium layer or a rough ruthenium oxide layer are provided. Such layers may be used in conjunction with non-rough ruthenium and/or non-rough ruthenium oxide layers to form conductive structures. For example, such structures may be part of a capacitor structure, e.g., bottom electrode of a capacitor.

38 Claims, 6 Drawing Sheets

U.S. PATENT DOCUMENTS

| | | | | |
|---|---|---|---|---|
| 5,935,648 | A | 8/1999 | Roberson et al. | 427/255.2 |
| 5,959,327 | A | 9/1999 | Sandhu et al. | 257/310 |
| 5,962,065 | A | 10/1999 | Weimer et al. | 427/8 |
| 5,962,716 | A | 10/1999 | Uhlenbrock et al. | 556/16 |
| 5,980,983 | A | 11/1999 | Gordon | 427/226 |
| 5,985,714 | A | 11/1999 | Sandhu et al. | 438/253 |
| 5,990,559 | A * | 11/1999 | Marsh | 257/768 |
| 6,015,743 | A | 1/2000 | Zahurak et al. | 438/398 |
| 6,037,220 | A | 3/2000 | Chien et al. | 438/255 |
| 6,049,101 | A | 4/2000 | Graettinger et al. | 257/296 |
| 6,060,351 | A | 5/2000 | Parekh et al. | 438/253 |
| 6,060,367 | A | 5/2000 | Sze | 438/398 |
| 6,063,705 | A * | 5/2000 | Vaarstra | 438/681 |
| 6,074,945 | A | 6/2000 | Vaartstra et al. | 438/681 |
| 6,078,072 | A | 6/2000 | Okudaira et al. | 257/295 |
| 6,114,557 | A | 9/2000 | Uhlenbrock et al. | 556/21 |
| 6,133,159 | A * | 10/2000 | Vaartstra et al. | 438/758 |
| 6,197,628 | B1 * | 3/2001 | Vaartstra et al. | 438/238 |

OTHER PUBLICATIONS

Anderson et al., "Carborane Complexes of Ruthenium: A Convenient Synthesis of [Ru(CO)$_3$ ($\eta^5$ –7,8–C$_2$B$_9$H$_{11}$)] and a Study of Reactions of This Complex," *Organometallics*, 14, 3516–3526 (1995).

Aoyama et al., "Chemical Vapor Deposition of Ru and Its Application in (Ba,Sr)TiO$_3$ Capacitors for Future Dynamic Random Access Memories," *Jpn. J. Appl. Phys.*, 38:2194–2199 (1999).

Bai et al., "Low–temperature growth and orientational control in RuO$_2$ thin films by metal–organic chemical vapor deposition", *Thin Solid Films*, 310, 75–80 (1997).

Bennett et al., "Mono–olefin Chelate Complexes of Iron(0) and Ruthenium (0) with an Olefinic Tertiary Phosphine," *J. Chem. Soc. D.*, 7, 341–342 (1971).

Cowles et al., "Relative Reactivity of Co–ordinated Ligands inthe Dienyltricarbonyl–ruthenium Cation, [(dienyl-)Ru(CO)$_3$]$^+$," *Chemical Commun.*, 392 (1969).

Green et al., "Chemical Vapor Deposition of Ruthenium and Ruthenium Dioxide Films," *J. Electrochem. Soc.*, 132, 2677–2685 (1985).

Igumenov, "MO CVD of Noble Metals", *J. De Physique IV*, 5, C5–489–C5–496 (1995).

Johnson et al., "Chemistry," *Nature*, 901–902 (1967).

Kaesz et al., "Low–Temperature Organometallic Chemical Vapor Deposition of Transition Metals," *Mat. Res. Soc. Symp. Proc.*, 131, 395–400 (1989).

Liao et al. "Characterization of RuO2 thin films deposited on Si by metal–organic chemical vapor deposition," *Thin Solid Films*, 287, 74–79 (1996).

Macchioni et al., "Cationic Bis–and Tris($\eta$2–(pyrazol–1–y1)methane) Acetyl Complexes of Iron (II) and Ruthenium (II): Synthesis, Characterization, Reactivity, and Interionic Solution Structure by NOESY NMR Spectroscopy," *Organometallics*, 16, 2139–2145 (1997).

Nakamura et al., "Embedded DRAM Technology compatible to the 0.13$\mu$m high–speed Logics by using Ru pillars in cell capacitors and peripheral vias," *IEEE*, (1998).

Park et al., "Metalorganic Chemical Vapor Deposition of Ru and RuO$_2$ Using Ruthenocene Precursor and Oxygen Gas," *J. Electrochem. Soc.*, 147:203–209 (2000).

Senzaki et al., Chemical Abstract 128:264103, *Proc. Electrochem. Soc.*, 97–25 (Chemical Vapor Deposition), 933–43 (1997).

Shin, "Characterization of RuO$_2$ Thin Films Prepared by Hot–Wall Metallorganic Chemical Vapor Deposition," *J. Electrochem. Soc.*, 144, 1055 (1997).

Sosinsky et al., "Hydrocarbon Complexes of Ruthenium. Part IV. Cyclic Dienyl Complexes", *J. Chem. Soc.*, 16–17, 1633–1640 (1975).

Takagi et al., "RuO$_2$ Bottom Electrodes for Ferroelectric (Pb,La)(Zr,Ti)O$_3$ Thin Fiolms by Metalorganic Chemical Vapor Deposition", *Jpn. J. Appl. Phys.*, 34, 4104–4107 (1995).

Versteeg et al., "Metalorganic Chemical Vapor Deposition By Pulsed Liquid Injection Using An Ultrasonic Nozzle: Titanium Dioxide on Sapphire from Titanium (IV) Isopropoxide," *Journal of the American Ceramic Society*, 78, 2763–2768 (1995).

Yuan, "Low–Temperature Chemical Vapor Deposition of Ruthenium Dioxide form Ruthenium Tetroxide: A Simple Approach to High–Purity RuO$_2$ Films," *Chem. Mater.*, 5, 908 (1993).

Yang, Doo Young et al., "Characterization of Ru Electrodes for Ru/(Ba,Sr)TiO$_3$/Ru Capacitors," *Ferroelectrics*, 1996. ISAF '96: Proceedings of the Tenth IEEE International Symposium on Applications of Ferroelectrics New York, NY, Aug. 18, 1996; pp. 515–518.

* cited by examiner

US 6,429,127 B1

METHODS FOR FORMING ROUGH RUTHENIUM-CONTAINING LAYERS AND STRUCTURES/METHODS USING SAME

FIELD OF THE INVENTION

The present invention relates to semiconductor devices and the fabrication thereof. More particularly, the present invention pertains to rough conductive layers of ruthenium and/or ruthenium oxide.

BACKGROUND OF THE INVENTION

In the fabrication of integrated circuits, various conductive layers are used. For example, during the formation of semiconductor devices, such as dynamic random access memories (DRAMs), conductive materials are used in the formation of storage cell capacitors and also may be used in interconnection structures, e.g., conductive layers of contact holes, vias, etc.

As memory devices become more dense, it is necessary to decrease the size of circuit components forming such devices. One way to retain storage capacity of storage cell capacitors of the memory devices and at the same time decrease the memory device size is to increase the dielectric constant of the dielectric layer of the storage cell capacitor. Therefore, high dielectric constant materials are used in such applications interposed between two electrodes. One or more layers of various conductive materials may be used as the electrode material.

Further, to the increase the capacitance for a storage cell capacitor of a memory device without increasing the occupation area of the storage cell capacitor, various techniques have been used to increase the surface area of the lower electrode of the capacitor. For example, hemispherical grains (HSG) have been used to enhance such surface area of the lower electrode of a capacitor of a memory device.

In one illustrative HSG technique, an HSG silicon surface is used as an underlayer for a metal layer to form a lower electrode having an increased surface area. For example, such a coextensive conductive layer formed over the hemispherical grain silicon surface may be formed of titanium nitride.

However, in many cases, the use of HSG to enhance surface area of the lower electrode is problematic. For example, when an HSG silicon surface is used as an underlayer for a metal in a container capacitor (e.g., a container capacitor such as described in U.S. Pat. No. 5,270,241 to Dennison, et al., entitled "Optimized Container Stack Capacitor DRAM Cell Utilizing Sacrificial Oxide Deposition and Chemical Mechanical Polishing," issued Dec. 14, 1993) there is a possibility of forming silicon dioxide between the HSG silicon surface and the metal layer of which the electrode is formed when the dielectric layer is being formed due to the diffusion of oxygen through the metal layer. Further, there is the possibility of silicon dioxide formation between the metal layer and the dielectric being formed due to the diffusion of silicon through the metal layer. Such silicon dioxide formation is likely due to the oxygen anneal required for formation of high dielectric constant materials, e.g., $Ta_2O_5$ or $BaSrTiO_3$, over the lower electrode.

However, reliable electrode connections are necessary. Formation of silicon dioxide as described above decreases the reliability of the electrode connection. Further, such silicon dioxide formation may result in a decreased series capacitance, thus degrading the storage capacity of the cell capacitor.

To prevent the diffusion of oxygen to the HSG silicon surface, or the diffusion of silicon through the metal layer, the use of a diffusion barrier, such as titanium nitride, may be used between the HSG silicon surface to form the lower electrode. The use of a diffusion barrier over the HSG silicon surface, however, also has problems associated therewith. For example, the container size of a container capacitor is relatively small. With use of multiple layers, such as HSG silicon surface, a diffusion barrier, and then a lower metal electrode layer, a container having an undesirably large size may be required.

Further, formation of a diffusion barrier layer over an increased surface area of an HSG silicon surface, and thereafter a lower metal electrode layer thereon, will decrease the effectiveness of the HSG layer to increase the surface area of the lower electrode. In other words, the surface area of the HSG silicon surface is decreased by application of the diffusion barrier layer, and then further decreased by the application of the lower electrode layer. In such a manner, the effectiveness of increasing the lower electrode surface area with use of HSG is diminished.

Further, grain size of an HSG silicon surface is somewhat limited. For example, such grain size is typically less than 200 Å in nominal diameter. As such, the increase in surface area provided through use of HSG is limited accordingly.

Generally, various metals and metallic compounds, for example, metals such as ruthenium and platinum, and conductive metal oxides, such as ruthenium oxide, have been proposed as the electrodes for at least one of the layers of an electrode stack for use with high dielectric constant materials. Ruthenium oxide and ruthenium electrodes have been employed as electrode materials because of the ability to easily etch such materials. For example, the article entitled, "$(Ba,Sr)TiO_3$ Films Prepared by Liquid Source Chemical Vapor Deposition on Ru Electrodes," by Kawahara et al., *Jpn. J. Appl. Phys.*, Vol. 35 (1996), Part 1, No. 9B (September 1996), pp. 4880–4885, describes the use of ruthenium and ruthenium oxide for forming electrodes in conjunction with high dielectric constant materials. As described therein, surface roughening of such materials is believed to attribute to degradation of the structures being formed.

Further, as described therein, ruthenium and ruthenium oxide materials were deposited by physical vapor deposition (PVD) processing, e.g., reactive RF sputtering processes. Many storage cell capacitors are fabricated which include electrode layers that are formed of a conductive material within a small high aspect ratio opening. Typically, sputtering does not provide a sufficiently conformal layer adequate for formation of an electrode layer within such a small high aspect ratio opening.

SUMMARY OF THE INVENTION

There is a need in the art to increase the surface area of a lower electrode structure without increasing the occupation area of the capacitor structure. Further, it is desirable that such an increase in surface area does not have one or more of the problems described above associated with the use of HSG. To overcome the problems described above, and others that will be readily apparent from the description below, rough conductive layers of ruthenium and/or ruthenium oxide are formed according to the present invention. For example, a rough conductive layer including ruthenium can be used as the lower or bottom electrode of a capacitor structure increasing the surface area of the lower electrode without increasing the occupation area and without the need for HSG silicon formation. As HSG silicon is not used, there is less danger of silicon dioxide formation. Further, the use of a rough conductive layer of ruthenium and/or ruthenium oxide may reduce processing costs by eliminating the need for HSG silicon formation and possibly formation of a diffusion barrier.

A method for forming a rough conductive layer (e.g., a layer having an RMS surface roughness in a range of about 50 Å to about 600 Å) in the fabrication of integrated circuits according to the present invention includes providing a substrate assembly in a reaction chamber with the substrate assembly including a surface. The substrate assembly surface is maintained at a temperature in a range of about 100° C. to about 400° C. and the pressure of the reaction chamber is maintained in a range of about 0.4 torr to about 10 torr. A carrier gas at a flow rate of about 100 sccm to about 500 sccm is provided through a ruthenium-containing precursor maintained at a temperature of about 15° C. to about 100° C. into the reaction chamber to deposit a rough ruthenium layer on the surface of the substrate assembly.

In various embodiments of the method, the method may include providing a diluent gas at a flow rate of about 100 sccm to about 500 sccm into the reaction chamber, the substrate assembly surface may be maintained at a temperature in the range of about 150° C. to about 250° C., the rough ruthenium layer may be deposited at a rate of about 100 Å/minute to about 500 Å/minute, and the method may further include annealing the rough ruthenium layer at a temperature in a range of about 300° C. to about 900° C. for a time period in a range of about 30 seconds to about 30 minutes. Further, the anneal may be performed in a gas atmosphere subjected to a glow discharge created by applying an electromagnetic field across the gas mixture.

In another method according to the present invention for forming a rough conductive layer in the fabrication of integrated circuits, a substrate assembly including a surface is provided in a reaction chamber. A ruthenium-containing precursor is provided into the reaction chamber and a rough ruthenium layer is deposited on the surface of the substrate assembly at a rate of about 100 Å/minute to about 500 Å/minute, preferably at a rate of about 200 Å/minute to about 300 Å/minute.

Another method for forming a rough conductive layer (e.g., a layer having an RMS surface roughness in a range of about 50 Å to about 600 Å) in the fabrication of integrated circuits according to the present invention includes providing a substrate assembly having a surface into a reaction chamber. A ruthenium-containing precursor is provided into the reaction chamber along with an oxygen-containing precursor. A rough ruthenium oxide layer is deposited on the surface of the substrate assembly at a rate of about 100 Å/minute to about 1200 Å/minute, preferably, at a rate of about 300 Å/minute to about 600 Å/minute.

In one embodiment of the method, the ruthenium-containing precursor is provided into the reaction chamber by providing a carrier gas at a flow rate of about 100 sccm to about 500 sccm through the ruthenium-containing precursor maintained at a temperature of about 15° C. to about 100° C., and then into the reaction chamber. Further, the oxygen-containing precursor is provided into the reaction chamber at a flow rate of about 100 sccm to about 2000 sccm.

In other embodiments of the method, the substrate assembly surface may be maintained at a temperature in a range of about 100° C. to about 400° C., the pressure of the reaction chamber may be maintained in a range of about 0.4 torr to about 100 torr, and the rough ruthenium oxide layer may be annealed at a temperature in a range of about 300° C. to about 900° C. for a time period in a range of about 30 seconds to about 30 minutes. Further, the anneal may be done in a gas atmosphere subjected to a glow discharge created by applying an electromagnetic field across the gas mixture.

A conductive structure according to the present invention includes at least a rough ruthenium layer. A surface of the rough ruthenium layer has a surface area greater than about 1.2 times a surface area of a completely smooth surface having a substantially identical shape as the surface of the rough ruthenium layer. Preferably, the surface area is greater than about 1.5 times the surface area of the completely smooth surface having the substantially identical shape as the surface of the rough ruthenium layer.

In other embodiments of the conductive structure, the conductive structure may include non-rough ruthenium upon which the rough ruthenium is formed. Likewise, the conductive structure may include non-rough ruthenium oxide upon which the rough ruthenium is formed.

Another conductive structure according to the present invention includes at least a rough ruthenium oxide layer. A surface of the rough ruthenium oxide layer has a surface area greater than about 1.2 times a surface area of a completely smooth surface having a substantially identical shape as the surface of the rough ruthenium oxide layer. Preferably, the surface area is greater than about 1.5 times the surface area of the completely smooth surface having the substantially identical shape as the surface of the rough ruthenium oxide layer.

In other embodiments of the conductive structure, the conductive structure may include non-rough ruthenium upon which the rough ruthenium oxide is formed.

In other embodiments of the present invention, the above methods and conductive structures may be formed as part of a capacitor structure. For example, the conductive structure may be formed as a first electrode or bottom electrode of a capacitor.

BRIEF DESCRIPTION OF THE DRAWINGS

The present invention will be better understood from reading the following description of illustrative embodiments with reference to the attached drawings, wherein below.

DETAILED DESCRIPTION OF THE EMBODIMENTS

The present invention shall be described generally with reference to FIGS. 1–2. Thereafter, an illustration of a capacitor structure application of the present invention shall be described with reference to FIG. 3 and Examples of forming rough ruthenium and rough ruthenium oxide layers are given with reference to FIGS. 4–7.

Figure 1A:
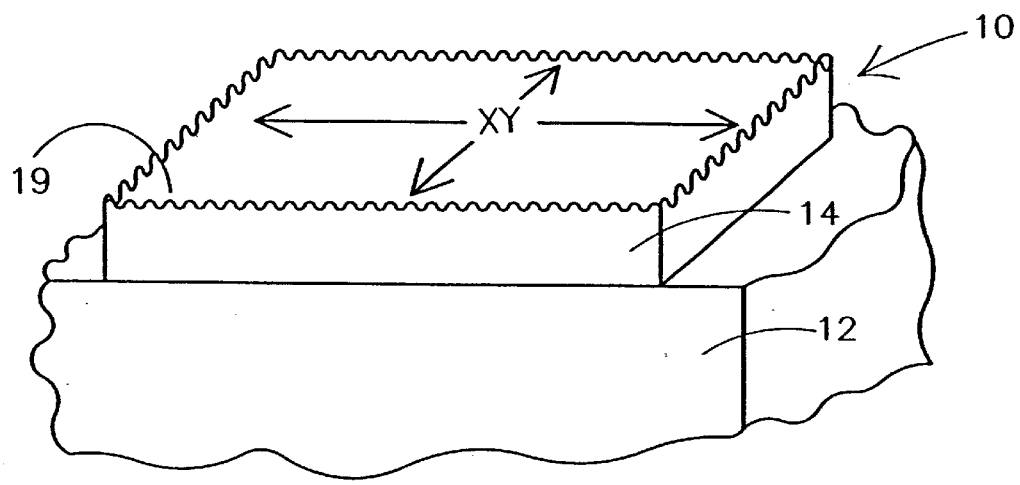
FIG. 1A generally shows a rough conductive layer of either ruthenium or ruthenium oxide formed on a substrate assembly according to the present invention.

FIG. 1A shows a structure 10 including a substrate assembly 12 and a roughened conductive layer 14, i.e., a layer having a rough surface 19. The present invention describes methods of forming roughened conductive layers by chemical vapor deposition and annealing. Generally, the roughened conductive layer 14 is formed of ruthenium and/or ruthenium oxide.

Roughened surfaces of conductive materials formed according to the present invention are particularly useful as a lower electrode of a capacitor structure for a memory device such as a DRAM. However, it should be understood that the methods of providing rough conductive layers including rough ruthenium and/or ruthenium oxide layers can be used in any application or structure in which a rough conductive layer would be useful.

As used in this application, substrate assembly refers to either a semiconductor substrate such as the base semiconductor layer, e.g., the lowest layer of a silicon material on a wafer, or a silicon layer deposited on another material, such as silicon on sapphire, or a semiconductor substrate having one or more layers or structures formed thereon or regions formed therein. When reference is made to a substrate assembly in the following description, various process steps may have been previously used to form or define regions, junctions, various structures or features, and openings such as vias, contact openings, high aspect ratio openings, etc. For example, as used herein, substrate assembly may refer to a structure upon which a lower electrode of a capacitor structure is formed.

It will be understood that the methods of the present invention are typically performed in chemical vapor deposition (CVD) chambers of the type used to process semiconductor wafers, although any equipment and method for depositing layers according to the present invention may be used. For example, the CVD processes described herein may be carried out in a chemical vapor deposition reactor, such as a reaction chamber available under the trade designation of 7000 from Genus, Inc. (Sunnyvale, Calif.), a reaction chamber available under the trade designation of 5000 from Applied Materials, Inc. (Santa Clara, Calif.), or a reaction chamber available under the trade designation of Prism from Novelus, Inc. (San Jose, Calif.). However, any reaction chamber suitable for performing CVD may be used.

Chemical vapor deposition is defined as the formation of a nonvolatile solid film on a substrate by reaction of vapor phase reactants, i.e., reacting gases, that contain desired components. The reacting gases are introduced into the reaction chamber. The gas is decomposed and reacted at a heated wafer surface to form the desired layer. Chemical vapor deposition is just one process of providing thin layers on semiconductor wafers, such as films of elemental metals or compounds, e.g., platinum, ruthenium, ruthenium oxide, etc. Chemical vapor deposition processes are capable of providing highly conformal layers even within deep contacts, container openings, and other openings. Thus, as described further below with reference to the figures, CVD processing is preferably used to provide high conformal layers within openings such as for lower electrodes of storage cell capacitors, e.g., container capacitors. It will be readily apparent to one skilled in the art that although CVD is the preferred process, the CVD process may be enhanced by various related techniques such as plasma assistance, photo assistance, laser assistance, as well as other techniques.

As used herein, the term "deposition temperature" will typically refer to the surface temperature of the substrate assembly or layer on which a material is being deposited; the term "flow rate" as used in connection with gas flow rates will typically refer to the gas flow rate into the CVD reaction chamber; and the term "deposition pressure" will typically refer to the pressure in the CVD chamber.

Further, it will be understood that as used in connection with the present invention, the term "annealing" may be performed in the CVD chamber and includes exposing a structure being formed to any combination of temperature and pressure for a predetermined time which will enhance the surface area of the rough conductive layer deposited. Such annealing may be performed in a gas atmosphere and with or without plasma enhancement.

One preferred method of forming a rough conductive layer 14 is by depositing a ruthenium layer by CVD. The CVD process is conducted with a ruthenium-containing precursor being delivered to a reaction chamber. Diluent gases may also optionally be provided to the reaction chamber.

The ruthenium-containing precursor may be a liquid or a solid at room temperature. Typically, however, such precursors are liquids. If they are solids, they are preferably sufficiently soluble in an organic solvent or have melting points below their decomposition temperature such that they can be used in flash vaporization, bubbling, microdroplet formation techniques, etc. However, they may also be sufficiently volatile that they can be vaporized or sublimed from the solid state using known chemical vapor deposition techniques. Thus, the precursor composition of the present invention can be in solid or liquid form. As used herein, "liquid" refers to a solution or a neat liquid (a liquid at room temperature or a solid at room temperature that melts at an elevated temperature). As used herein, a "solution" does not require complete solubility of the solid; rather, the solution may have some undissolved material. Preferably, however, there is a sufficient amount of the material that can be carried by the organic solvent into the vapor phase for chemical vapor deposition processing.

Preferably, the ruthenium-containing precursor is generally a liquid precursor. The ruthenium-containing precursor may be, for example, tricarbonyl (1,3-cyclohexadiene)Ru, $(C_{11}H_{19}O_2)_2(C_8H_{12})Ru$, or any other suitable ruthenium-containing precursor.

If the ruthenium-containing precursor is a liquid, it may be delivered through use of bubbling techniques. Generally, the liquid precursor is contained in a bubble reservoir through which a carrier gas, such as helium or any other inert gas, i.e., a gas that is nonreactive with other gases in the process (e.g., nitrogen, argon, neon, and xenon) is passed. In other words, the carrier gas is bubbled through the reservoir containing the precursor to deliver the precursor to the reaction chamber.

One skilled in the art will recognize that the manner in which the gases are introduced into the reaction chamber may include one of various techniques. For example, in addition to provision by bubbler techniques, the introduction may be accomplished with the use of compounds which are gases at room temperature or by heating a volatile compound and delivering the volatile compound to the reaction chamber using a carrier gas. Further, solid precursors and various methods of vaporizing such solid precursors may also be used for introduction of reactant compounds into the chamber. As such, the present invention is not limited to any particular technique.

Further, typically, the reacting gases are admitted at separate inlet ports. In addition to the other gases provided to the reaction chamber, an optional diluent gas, i.e., a gas that is nonreactive with the reacting gases, may also be introduced in the chamber such as to change the partial pressures of the gases therein. For example, argon or nitrogen may be introduced into the chamber at a varied flow rate.

To achieve the desired roughness for the rough conductive layer 14 formed of ruthenium, a relatively high deposition rate is used. However, step coverage must be maintained at the high deposition rate. To maintain such step coverage, a high concentration of ruthenium-containing precursor to the reaction chamber must be provided.

Preferably, the deposition rate for forming a rough ruthenium layer 14 while maintaining step coverage is a deposition rate in the range of about 100 Å/minute to about 500 Å/minute. More preferably, the deposition rate is in a range of about 200 Å/minute to about 300 Å/minute. Yet further, to maintain the step coverage with a high concentration of ruthenium-containing precursor provided to the reaction chamber, preferably, a flow rate of about 100 sccm to about 500 sccm of carrier gas (e.g., He, $O_2$, or any other gas that is non-reactive with the precursor) through a ruthenium-containing precursor held in a bubbler reservoir at a temperature of about 15° C. to about 100° C. is provided to the chamber. More preferably, the flow rate of carrier gas through the ruthenium-containing precursor to the reaction chamber is at a rate in the range of about 150 sccm to about 250 sccm.

Further, to achieve the desired higher deposition rate as described above, various other parameters of the CVD process may be varied. Preferably, the deposition pressure of the CVD process is in the range of about 0.4 torr to about 10 torr. More preferably, the pressure is in the range of about 2 torr to about 4 torr. Further, the deposition temperature of the CVD process is preferably in a range of about 100° C. to about 400° C. More preferably, the deposition temperature is in the range of about 150° C. to about 250° C.

Preferably, the CVD process is performed without any plasma enhancement. Further, preferably, a diluent gas is provided into the reaction chamber at a rate of about 100 sccm to about 500 sccm. Preferably, the diluent gas is one of nitrogen or argon.

The flow rate of the ruthenium-containing precursor into the reaction chamber can be increased in a number of manners. For example, a higher bubbler temperature can be used when the ruthenium-containing precursor is provided to the reaction chamber through the use of a bubbler. However, preferably the ruthenium-containing precursor is held at room temperature. Further, shorter and/or larger gas lines may also be used to increase the concentration of the ruthenium-containing precursor in the reaction chamber, e.g., a shorter gas line allows the pressure in chamber holding the ruthenium-containing precursor to be lower which increases the amount of precursor in the carrier gas.

According to the present invention, the roughness of the ruthenium layer 14 is greater at increased deposition pressures within the range described above. Further, the roughness of the ruthenium layer 14 is greater at increased deposition temperatures. Such CVD parameters may be varied to attain a desired roughness within the ranges as described herein.

Figure 1B:
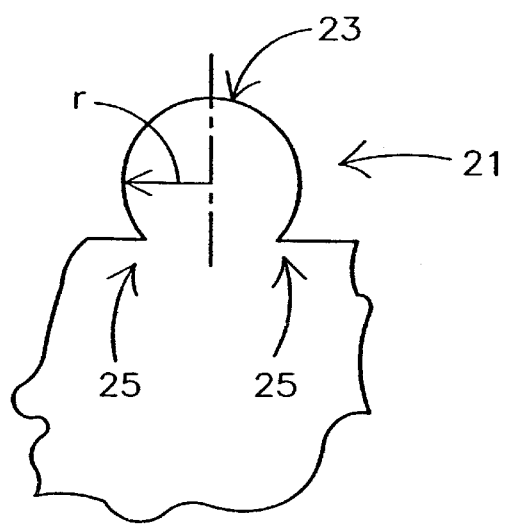
FIG. 1B is a detailed diagram of a portion of a surface of the rough conductive layer of FIG. 1A.

The roughness of the surface of a rough ruthenium layer 14 useful in accordance with the present invention may be characterized in one or more different manners as described below. One manner of characterizing a rough ruthenium layer is based on the RMS (root mean square) surface roughness of the rough ruthenium layer. Preferably, a rough ruthenium layer has an RMS surface roughness in a range of about 50 Å to about 600 Å. RMS (root mean square) surface roughness may be determined using, for example, Atomic Force Microscopy (AFM), Scanning Tunneling Microscopy (STM), or Scanning Electron Microscopy (SEM) and is based on a statistical mean of an R-range, wherein the R-range is a range of the radius (r) (as shown in FIG. 1B) of a grain size. The determination of RMS (root mean square) surface roughness is known to those skilled in the art.

Alternatively, or in addition to other manners of characterizing the rough layer, the rough ruthenium layer may be characterized based on the cross-section grain size of the grains of the layer being deposited. Preferably, the nominal cross-section grain size is represented by the nominal diameter through the center of the grains. The nominal diameter for a rough ruthenium layer is preferably in the range of about 100 Å to about 800 Å. More preferably, the cross-section nominal diameter through the center is in the range of about 200 Å to about 500 Å.

Alternatively, or in addition to other manners of characterizing the rough layer, a rough ruthenium surface may be characterized based on a comparison of the surface area of the rough ruthenium surface relative to the surface area of a completely smooth surface (i.e., a surface with no grain structure, e.g., valleys, peaks, etc.) having a substantially identical shape as the rough surface, e.g., the shape of the structure upon which the rough layer is deposited. Preferably, a rough surface (e.g., all or a portion of a conductive layer), wherein preferably the rough surface is a generally homogenous surface (i.e., a surface structure without any substantial irregularities from one part of the surface to another part of the surface such as, for example, deep depressions, large spikes, unusually large grains compared to the other grains of the layer, etc.), has a surface area greater than about 1.2 times the surface area of a completely smooth surface having a substantially identical shape (i.e., substantially identical shapes having the same base dimensional characteristics, e.g., in the case of a planar surface the occupancy area of both the completely smooth and rough surface are equivalent). The surface shape may be of a planar shape, a curved shape, a container shaped structure such as in a container capacitor, or any other shape. More preferably, the roughness of the surface has a surface area that is greater than about 1.5 times the surface area of a completely smooth surface having a substantially identical shape.

For example, as shown in FIG. 1A, the rough surface 19 of conductive layer 14 has a generally planar shape. The surface area of the rough surface 19 of the conductive layer 14 can be compared to a surface area (XY) of a completely smooth surface having a planar shape, i.e., a shape identical to the shape of the rough surface 19. Therefore, preferably, the surface area of rough surface 19 of the conductive layer 14 is greater than about 1.2(XY).

As shown in FIG. 1B, the rough surface 19 includes regions 21, i.e., grains, projecting from the layer 14. As such, peaks and valleys are formed, e.g., peaks 23 and valleys 25. One skilled in the art will recognize that HSG silicon have grains with similar peaks and valleys like that of the formed rough surface 19. It is the valleys 25 which when covered by a diffusion barrier layer in HSG techniques tend to decrease the effectiveness of increasing the surface area using such HSG silicon. For example, with such valleys being filled by diffusion barrier material, they are no longer available to provide effective increased surface area. Since the rough ruthenium layer 14 does not necessarily require any other layer formation over the surface 19, such valleys are generally available to provide increased surface area, such as for increased capacitance in a capacitor structure. The grain size for ruthenium is typically less than about 800 Å in nominal diameter.

After deposition of the rough ruthenium layer 14, an optional anneal of the structure may be used to further enhance and/or increase the surface area at rough surface 19 of the rough ruthenium layer 14. For example, the cross section grain size of the deposited ruthenium may grow by about 100 percent with use of an annealing process. Preferably, the structure is annealed at a pressure of about 0.1 millitorr to about 5 atmospheres. Preferably, the anneal is performed at a pressure in the range of about 0.1 millitorr to 5 atmospheres. More preferably, the anneal is performed at a pressure of about 1 torr to about 800 torr. Further, the anneal is performed at a temperature in the range of about 300° C. to about 900° C. More preferably, the anneal is performed at a temperature in the range of about 500° C. to about 700° C. The anneal is preferably performed for a time period of between 30 seconds to 30 minutes.

Further, the anneal may be performed while the structure is present in a gas environment. Preferably, the gas environment is an atmosphere of oxygen, ozone, argon, nitrogen, etc., or any other combination thereof, such as, for example, oxygen and nitrogen or oxygen and argon. The anneal may be a plasma enhanced anneal wherein the gas atmosphere is subjected to a glow discharge created by applying an electromagnetic field across the gas. Use of a plasma process allows the structure to be kept at a somewhat lower temperature during the anneal while still achieving increased grain size. Any suitable power source may be used to generate the plasma in the reaction chamber. Suitable power sources, for example, include an RF generator, a microwave (e.g., 2.5 gigahertz microwave source) generator, or an electron cyclotron resonance (ECR) source. A preferred power source is an RF generator operating as a standard 13.56 MHz source. Preferably, the gas is subjected to the glow discharge or plasma created by applying the radio frequency electromagnetic field of 13.56 MHz at a power density of 5 kilowatts/cm$^2$ or less across the gas. It is preferable that a plasma enhancement be used so that the intersection between the ruthenium-containing layer and the underlying layer, e.g., silicon, is minimized. However, plasma enhancement is an optional annealing technique.

The anneal may be performed as a furnace anneal or a rapid thermal processing (RTP) anneal may be used. Further, such anneals may be performed in one or more annealing steps within the time periods, temperature ranges, and other parameters set forth above.

Another preferred method of forming a rough conductive layer 14 is by depositing a rough ruthenium oxide layer by CVD. The CVD process is conducted with a ruthenium-containing precursor being delivered to a reaction chamber along with an oxygen-containing precursor being delivered to the reaction chamber. Further, diluent gases may also optionally be provided to the reaction chamber. Preferably, the oxygen-containing precursor is oxygen, ozone, $N_2O$, CO, $CO_2$, or any other suitable oxygen-containing precursor.

To achieve the desired roughness for the rough conductive layer 14 formed of ruthenium oxide, a relatively high deposition rate is used. However, step coverage must be maintained at the high deposition rate. To maintain such step coverage, a high concentration of ruthenium-containing precursor and oxygen-containing precursor must be provided to the reaction chamber.

Preferably, the deposition rate for forming a rough ruthenium oxide layer 14 while maintaining step coverage is a deposition rate in the range of about 100 Å/minute to about 1200 Å/minute. More preferably, the deposition rate is in a range of about 300 Å/minute to about 600 Å/minute. Yet further, to maintain the step coverage with a high concentration of ruthenium-containing precursor provided to the reaction chamber, preferably, a flow rate of about 100 sccm to about 500 sccm of carrier gas (e.g., He, $O_2$, or any other gas that is non-reactive with the precursor) through a ruthenium-containing precursor held in a bubbler reservoir at a temperature of about 15° C. to about 100° C. is provided to the chamber. More preferably, the flow rate of the carrier gas is at a rate in the range of about 200 sccm to about 300 sccm. Further, preferably, a flow rate of about 100 sccm to about 2000 sccm of the oxygen-containing precursor is provided to the chamber. More preferably, the flow rate of the oxygen-containing precursor to the reaction chamber is at a rate in the range of about 500 sccm to about 1000 sccm.

Further, to achieve the desired higher deposition rate for ruthenium oxide as described above, various other parameters of the CVD process may be varied. Preferably, the deposition pressure of the CVD process is in the range of about 0.4 torr to about 100 torr. More preferably, the pressure is in the range of about 1 torr to about 10 torr. Further, the deposition temperature of the CVD process is preferably in a range of about 100° C. to about 400° C. More preferably, the deposition temperature is in the range of about 100° C. to about 250° C.

Preferably, the CVD process is performed without any plasma enhancement. Further, preferably, a diluent gas is provided into the reaction chamber at a rate of about 100 sccm to about 1000 sccm. Preferably, the diluent gas is one of nitrogen or argon.

According to the present invention, the roughness of the ruthenium oxide layer 14 is greater at increased deposition pressures within the range described above. Further, the roughness of the ruthenium oxide layer 14 is greater at increased deposition temperatures. Such CVD parameters may be varied to attain a desired roughness within the ranges as described herein.

The roughness of the rough ruthenium oxide layer useful in accordance with the present invention may be characterized in one or more different manners just like the rough ruthenium layer as described above. The same ranges for the same roughness characteristics set forth above for the ruthenium layer are applicable as well to the ruthenium oxide layers.

After deposition of the rough ruthenium oxide layer 14, an optional anneal of the structure may be used to further enhance and/or increase the surface area at rough surface 19 of the rough ruthenium layer 14. Substantially the same parameters and ranges as set forth above for the ruthenium layer are applicable as well to formation of the ruthenium oxide layer.

When a rough ruthenium or ruthenium oxide layer is formed as the lower electrode of a capacitor structure, the thickness of the rough ruthenium lower electrode or the rough ruthenium oxide lower electrode is generally in the range of about 100 Å to about 600 Å.

One skilled in the art will recognize that the rough ruthenium oxide and/or ruthenium layers described above may be used in addition to other layers of a structure. For example, an electrode may be a multi-layer electrode formed of other metals with an upper layer formed of a rough ruthenium layer or a rough ruthenium oxide layer. Further, for example, such a layer used with the rough ruthenium layer or rough ruthenium oxide layer may be a barrier layer as described below with reference to FIG. 3.

Although the rough ruthenium layer and/or the rough ruthenium oxide layer described above may be used for one or more numerous applications, e.g., interconnection applications, capacitor applications, etc., the present invention is useful when forming layers in small high aspect ratio openings. As described herein, small high aspect ratio openings have feature sizes or critical dimensions below about 1 micron (e.g., such as a diameter or width of an opening being less than about 1 micron), and aspect ratios greater than about 1. Such aspect ratios are applicable to contact holes, vias, trenches, and any other configured openings, such as container or trench openings for formation of capacitor structures. For example, a trench having an opening of 1 micron and a depth of 3 microns has an aspect ratio of 3.

Figure 2A:
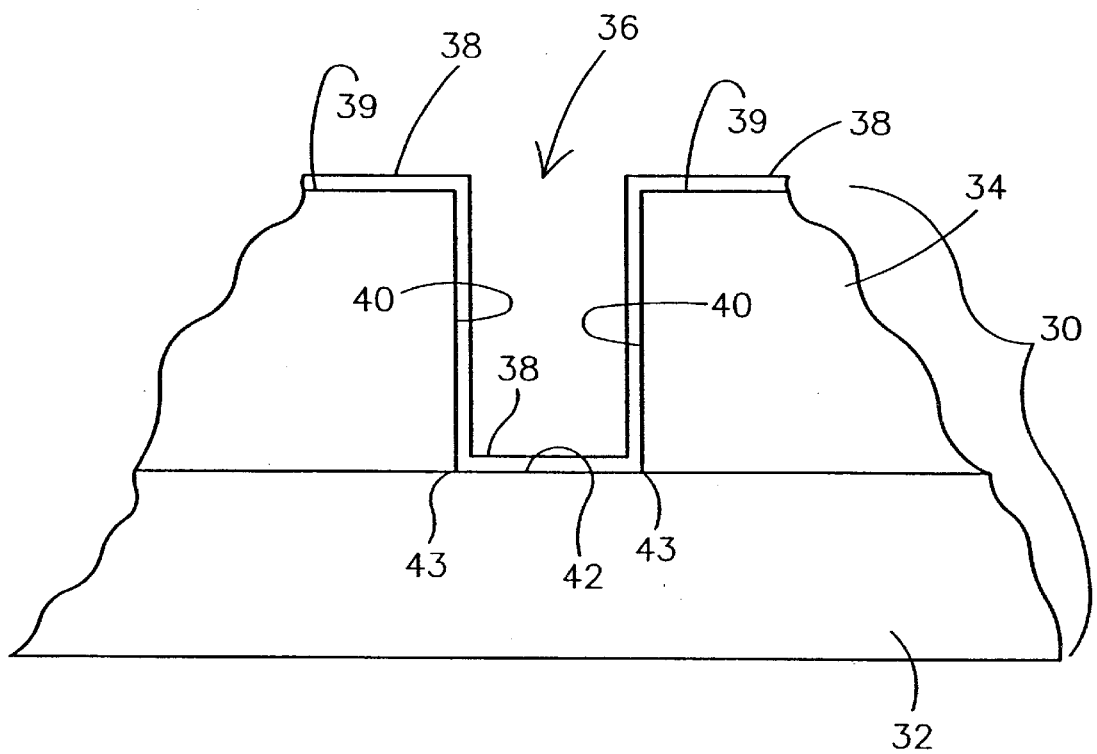
FIGS. 2A–2D illustrate a multiple step method of forming a rough lower electrode according to the present invention for use in a capacitor structure.
Figure 2B:
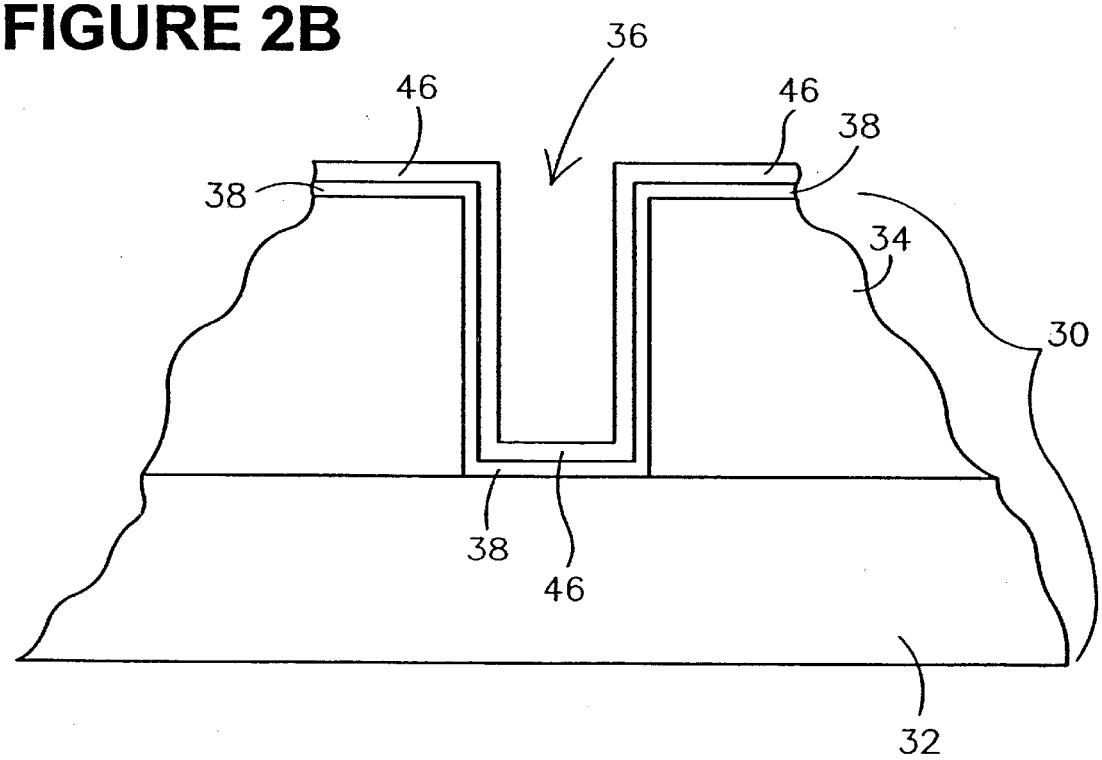
Figure 2C:
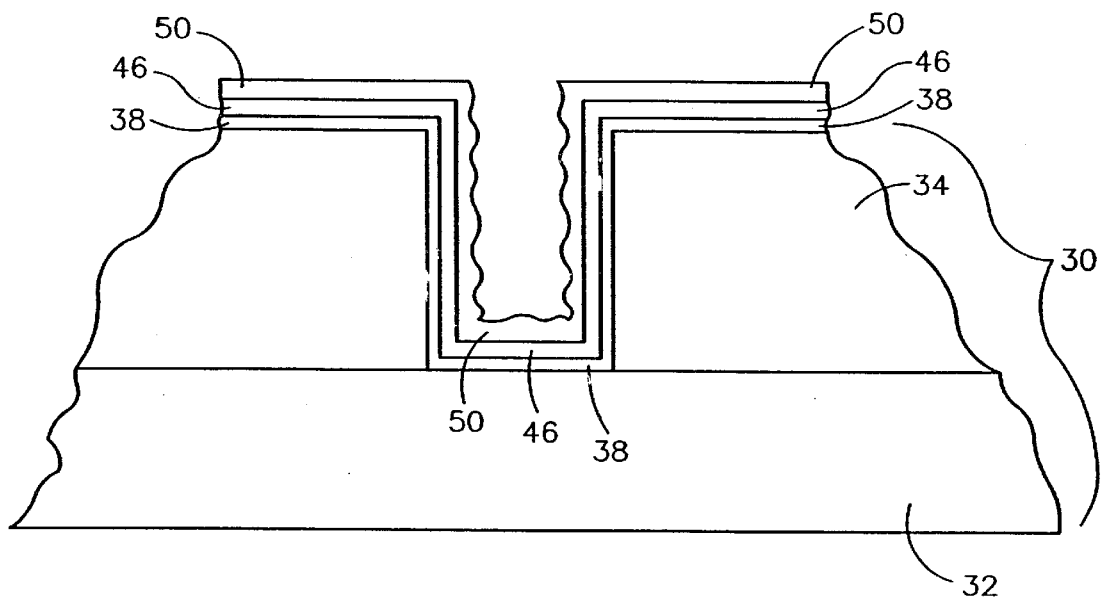
Figure 2D:
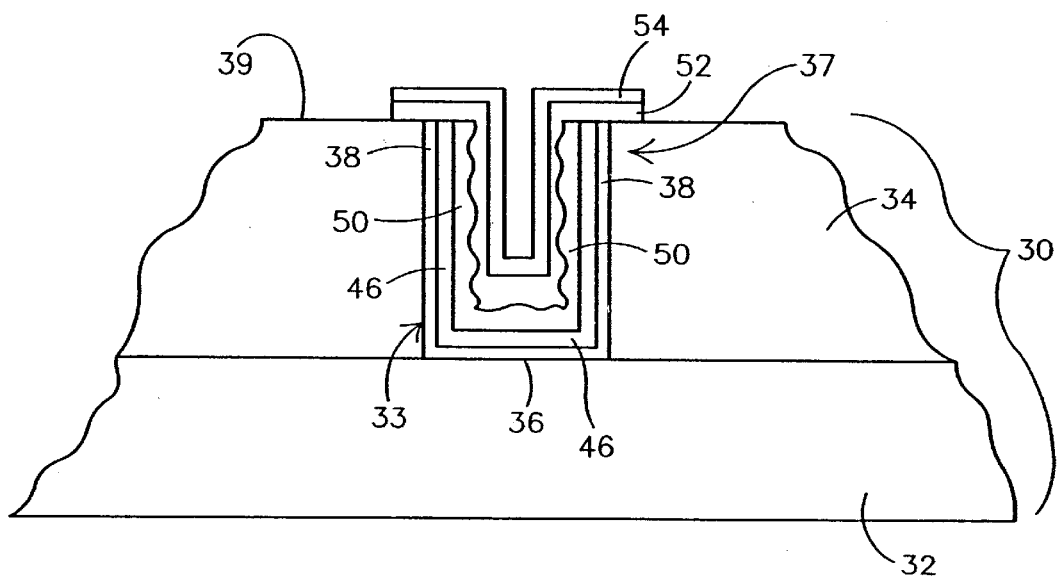

FIGS. 2A–2D illustrate a method of forming a lower electrode for a container structure according to a multiple step method of the present invention. The lower electrode 33 of capacitor structure 37, as shown in FIG. 2D, is formed using a rough conductive layer according to the present invention, e.g., such as those described with reference to FIG. 1. The lower electrode 33 is preferably formed according to two steps. However, more than two steps may be used if additional layers are desired. Preferably, the two steps are used to form a ruthenium layer that is not rough over which a rough ruthenium oxide layer or a rough ruthenium layer is formed. Likewise, preferably, the two steps may be used to form a ruthenium oxide layer that is not rough over which a rough ruthenium layer or a rough ruthenium oxide layer is formed. For simplicity purposes, the multiple step method according to the present invention shall be described with reference to FIGS. 2A–2D with formation of a container capacitor structure wherein, first, a ruthenium layer that is not rough is formed, and thereafter a rough ruthenium layer is formed according to the previous description herein. The other possible combinations of layers and formation thereof will be readily apparent from reading the simplistic description using a non-rough ruthenium layer and a rough ruthenium layer.

It will be recognized that the multiple ruthenium-containing layers may be described as a single layer graded in grain size, e.g., rough ruthenium formed over non-rough ruthenium, as opposed to multiple layers. In other words, for example, as opposed to forming layers, non-rough ruthenium is formed over which rough ruthenium is deposited without a particular layer transition. As such, the entire graded layer may be formed in a single continuous step, e.g., with a change in process parameters.

FIG. 2A shows a substrate assembly 30 which includes a first substrate portion 32 and a second substrate portion 34. Substrate portion 34 is formed on substrate portion 32 and includes an opening 36 defined therein by a bottom surface 42 of first substrate portion 32 and one or more side walls 40 of second substrate portion 32. The second portion 34 of substrate assembly 30 includes a region to which a lower electrode of capacitor structure 37 is electrically connected. The second portion 34 of the substrate assembly 30 is an insulative layer such as an oxide layer, e.g., silicon dioxide,, BPSG, PSG, etc. As such, opening 36, defined in substrate assembly 30 by bottom surface 42 and the one or more side walls 40, includes surfaces upon which a bottom lower electrode for a storage cell capacitor is formed, such as for use in a memory cell. Such a container capacitor is also described further herein with reference to FIG. 3.

The capacitor structure 37 is formed with a rough lower electrode 33 as illustrated in FIGS. 2A–2D by first forming an optional barrier layer 38 in the defined opening 36 and on surfaces such as upper surface 39. For example, such a barrier layer may have a thickness of about 50 Å to about 300 Å. One example of a barrier layer includes the formation of a titanium nitride layer having a thickness of about 100 Å to about 200 Å. Preferably, according to the present invention, the barrier layer and the other layers herein are deposited using CVD processes such that conformal coverage or step coverage within the defined opening 36 and at various other portions of the structure, such as corners 43, are conformally covered with the material being deposited.

After formation of the barrier layer 38, a ruthenium layer 46 is deposited as shown in FIG. 2B. The ruthenium layer 46 is formed by CVD processing under conditions necessary to form a layer that is not rough. For example, such conditions will include at least one condition that is different than the conditions used to form a rough ruthenium layer as previously described herein. Preferably, according to the present invention, a non-rough ruthenium layer may be formed using conditions in the following ranges: a flow rate of about 100 sccm to about 500 sccm of carrier gas (e.g., He, $O_2$, or any other gas that is non-reactive with the precursor) through a rutheniumn-containing precursor held in a bubbler reservoir at a temperature of about 15° C. to about 100° C.; a deposition pressure in the range of about 0.4 torr to about 10 torr; a deposition temperature in a range of about 100° C. to about 400° C.; and a diluent gas (e.g., nitrogen and/or argon) provided into the reaction chamber at a rate of about 100 sccm to about 500 sccm.

Thereafter, by changing only one or more conditions of the deposition process (with no additional precursors being required) a rough ruthenium layer 50 is deposited over the ruthenium layer 46 as shown in FIG. 2C. For example, the ruthenium layer 46 may have a thickness in the range of about 50 Å to about 300 Å, and the rough ruthenium layer 50 may have a thickness in the range of about 100 Å to about 500 Å. The rough ruthenium layer 50 is formed according to the present invention as previously described herein.

When the combination of layers of rough lower electrode 33 includes a ruthenium oxide layer that is not rough, the non-rough ruthenium oxide layer is generally deposited within the following condition ranges: a flow rate of about 100 sccm to about 500 sccm of carrier gas (e.g., He, $O_2$, or any other gas that is non-reactive with the precursor) through a ruthenium-containing precursor held in a bubbler reservoir at a temperature of about 15° C. to about 100° C.; a flow rate of about 100 sccm to about 2000 sccm of the oxygen-containing precursor; a deposition pressure in the range of about 0.4 torr to about 100 torr; a deposition temperature in a range of about 100° C. to about 400° C.; and a diluent gas (e.g., nitrogen and/or argon) at a rate of about 100 sccm to about 1000 sccm.

After the optional anneal for the rough ruthenium layer 50, the resultant structure is as shown in FIG. 2C. The layers for forming the lower electrode 33 are then planarized to the upper surface 39 of second portion 34 of substrate assembly 30 such that the opening 36 is lined with the rough conductive electrode 33.

Thereafter, as shown in FIG. 2D, a dielectric layer 52 is then formed relative to the rough conductive electrode 33. For example, the dielectric layer may be any suitable material having a suitable dielectric constant. Preferably, a suitable dielectric constant is a high dielectric constant material such as those materials having a dielectric constant of greater than about 25. For example, a suitable dielectric constant material for forming dielectric layer 52 may include, but is clearly not limited to, tantalum pentoxide (Ta$_2$O$_5$), Ba$_x$Sr$_{(1-x)}$TiO$_3$[BST], BaTiO$_3$, SrTiO$_3$, PbTiO$_3$, Pb(Zr,Ti)O$_3$[PZT], (Pb,La)(Zr,Ti)O$_3$[PLZT], (Pb,La)TiO$_3$ [PLT], KNO$_3$, and LiNbO$_3$.

Further, after formation of the dielectric layer 52, a second electrode 54 is formed relative to the dielectric material 52. For example, the second electrode 54 may be formed of a material such as tungsten nitride, titanium nitride, tantalum nitride, platinum metals and alloys thereof, or any suitable electrode material including ruthenium and/or ruthenium oxide. Such a dielectric layer 52 and top electrode material 54 are then etched to form the desired capacitor structure 37.

A more specific illustration of using the above-described processes is described below with reference to FIG. 3 wherein a rough conductive lower electrode 187 is formed according to one of the processes described herein for a high dielectric capacitor of a storage cell. There are other semiconductor processes and structures for various devices, e.g., CMOS devices, memory devices, etc., that would benefit from the present invention and in no manner is the present invention limited to the illustrative embodiments described herein, e.g., an electrode structure.

Figure 3:
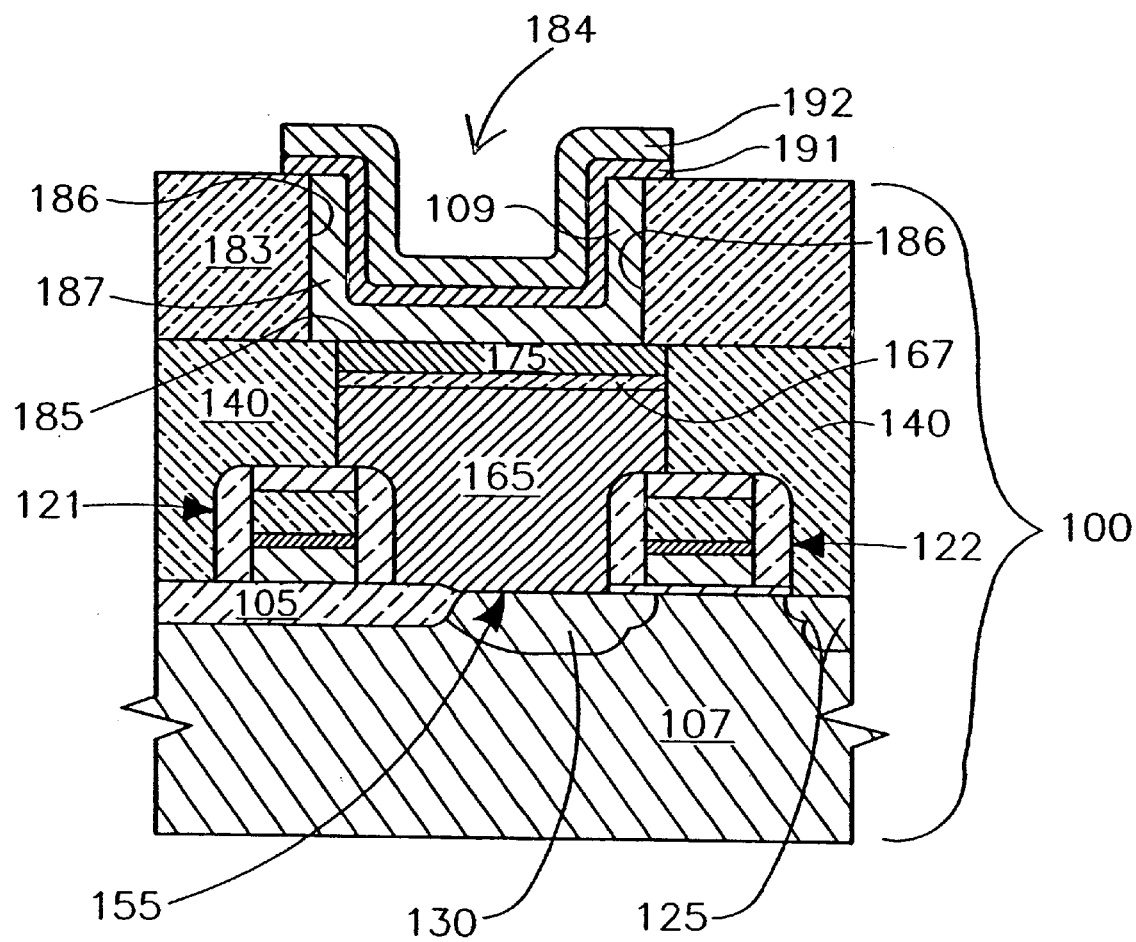
FIG. 3 is an illustrative diagram of a container capacitor structure using a rough lower electrode formed according to the present invention in a storage cell capacitor application.

As shown in FIG. 3, a device structure 100 is fabricated in accordance with conventional processing techniques through the formation of an opening 184. Such processing is performed prior to depositing a bottom electrode structure 187 on the surfaces defining the opening 184 using the methods in accordance with the present invention. Although any of the methods described previously herein may be used to form the bottom electrode structure 187 on the surfaces defining the opening 184, for simplicity, this particular illustration shall be only described with the use of a single rough ruthenium layer. However, one skilled in the art will recognize that any of the single or multiple step electrode formation processes described herein may be used to form the bottom electrode structure 187. As such, and as further described in U.S. Pat. No. 5,392,189 to Fazan et al., entitled "Capacitor Compatible with High Dielectric Constant Materials Having Two Independent Insulative Layers and the Method for Forming Same," issued Feb. 21, 1995, the device structure 100 includes field oxide regions 105 and active regions, i.e., those regions of the substrate 107 not covered by field oxide. A word line 121 and a field effect transistor (FET) 122 are formed relative to the field oxide 105. Suitable source/drain regions 125, 130 are created in silicon substrate 107. An insulative conformal layer of oxide material 140 is formed over regions of FET 122 and word line 121. A polysilicon plug 165 is formed to provide electrical communication between substrate 107 and a storage cell capicitor to be formed thereover. Various barrier layers are formed over the polysilicon plug 165, such as, for example, layers 167 and 175. For example, such layers may be titanium nitride, tungsten nitride, or any other metal nitride which acts as a barrier. Thereafter, another insulative layer 183 is formed and the opening 184 is defined therein.

According to one embodiment of the present invention, a rough ruthenium layer is formed according to the present invention on the structure including bottom surface 185 and the one or more side walls 186 defining opening 184. The roughened ruthenium layer is then planarized or etched back resulting in the rough ruthenium layer 187 lining the opening 184. A dielectric layer 191 formed of material such as described above is then formed relative to the rough ruthenium layer 187. Further, thereafter, a second electrode 192 is formed relative to the dielectric material 191.

In each of the following Examples, no anneal was performed on the films formed.

EXAMPLE 1

Figure 4:
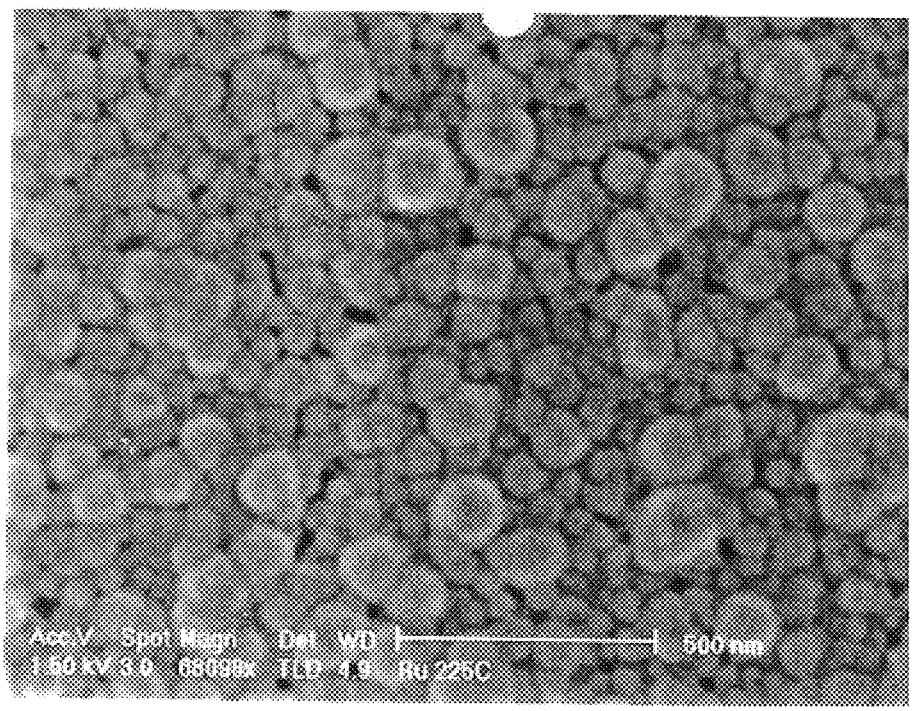
FIGS. 4–5 are example ruthenium layers for illustrating the comparison of rough and non-rough ruthenium layers.

A rough ruthenium layer as shown in FIG. 4 was formed on an HF cleaned silicon wafer in a single wafer reaction chamber under the following conditions:
- a flow rate of about 200 sccm of helium carrier gas through a tricarbonyl (1,3-cyclohexadiene)Ru precursor held in a bubbler reservoir at room temperature (i.e., about 25° C.);
- a deposition pressure of 3.0 torr; and
- a deposition temperature of 225° C.

EXAMPLE 2

Figure 5:
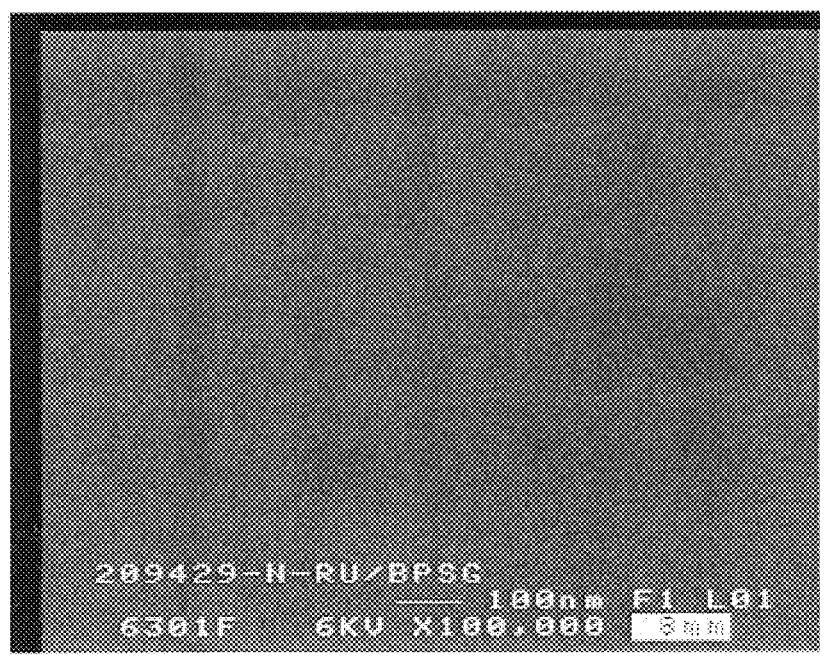

A non-rough ruthenium layer as shown in FIG. 5 was formed on HF cleaned BPSG of a silicon wafer in a single wafer reaction chamber under the following conditions:
- a flow rate of about 200 sccm of helium carrier gas through a tricarbonyl (1,3-cyclohexadiene)Ru precursor held in a bubbler reservoir at room temperature (i.e., about 25° C.);
- a deposition pressure of 1.5 torr; and
- a deposition temperature of 250° C.

EXAMPLE 3

Figure 6:
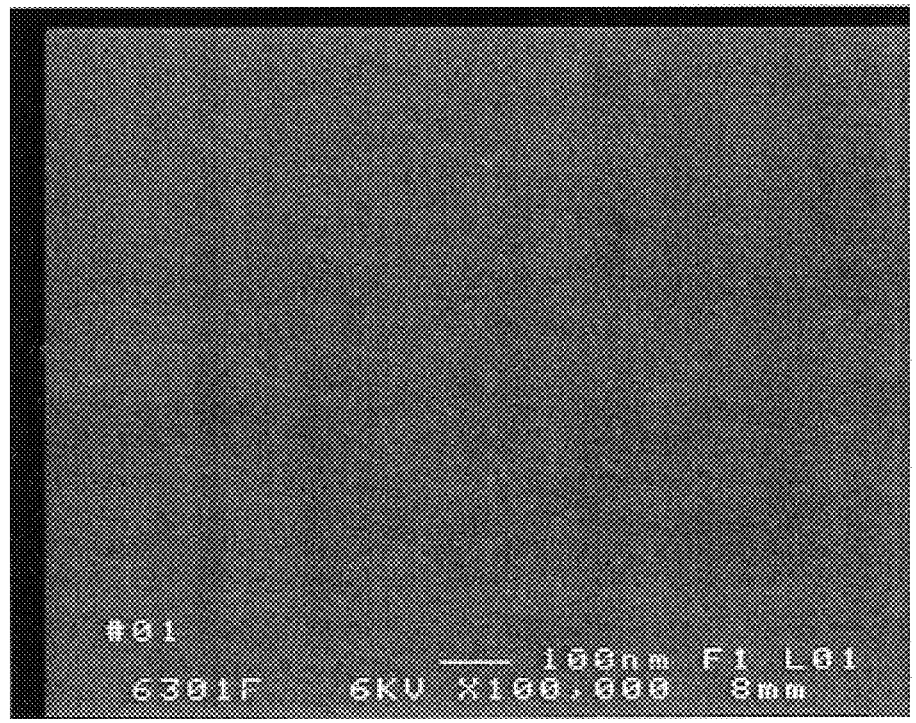
FIGS. 6–7 are example ruthenium oxide layers for illustrating the comparison of non-rough and rough ruthenium oxide layers.

A ruthenium oxide layer that is not rough as shown in FIG. 6 was formed on an HF cleaned silicon wafer in a single wafer reaction chamber under the following conditions:
- a flow rate of about 225 sccm of helium carrier gas through a tricarbonyl (1,3-cyclohexadiene)Ru precursor held in a bubbler reservoir at room temperature (i.e., about 25° C.);
- a flow rate of about 250 sccm of oxygen gas;
- a deposition pressure of 2.5 torr; and
- a deposition temperature of 210° C.

EXAMPLE 4

Figure 7:
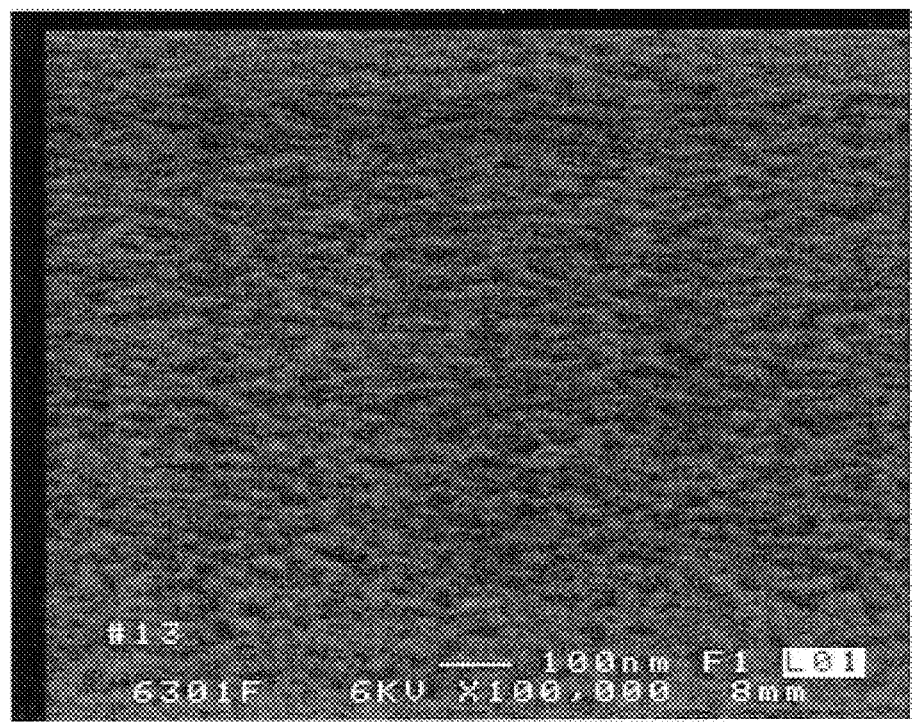

A rough ruthenium oxide layer as shown in FIG. 7 was formed on an HF cleaned silicon wafer in a single wafer reaction chamber under the following conditions:
- a flow rate of about 200 sccm of helium carrier gas through a tricarbonyl (1,3-cyclohexadiene)Ru precursor held in a bubbler reservoir at room temperature (i.e., about 25° C.);
- a flow rate of about 100 sccm of oxygen gas;
- a deposition pressure of 3 torr; and
- a deposition temperature of 200° C.

All patents and references cited herein are incorporated in their entirety as if each were incorporated separately. This invention has been described with reference to illustrative embodiments and is not meant to be construed in a limiting sense. As described previously, one skilled in the art will recognize that various other illustrative applications may utilize the rough ruthenium-containing layers as described herein. Various modifications of the illustrative embodiments, as well as additional embodiments of the invention, will be apparent to persons skilled in the art upon reference to this description. It is therefore contemplated that the appended claims will cover any such modifications or embodiments that may fall within the scope of the present invention as defined by the accompanying claims.

What is claimed is:

1. A method for forming a rough conductive layer in the fabrication of integrated circuits, the method comprising:

providing a substrate assembly in a reaction chamber, the substrate assembly including a surface;

maintaining the substrate assembly surface at a temperature in a range of about 100° C. to about 400° C.;

maintaining the pressure of the reaction chamber in a range of about 0.4 torr to about 10 torr; and providing a carrier gas at a flow rate of about 100 sccm to about 500 sccm through a ruthenium-containing precursor maintained at a temperature of about 15° C. to about 100° C. into the reaction chamber to deposit a rough ruthenium layer on the surface of the substrate assembly.

2. The method of claim 1, wherein the method further includes providing a diluent gas at a flow rate of about 100 sccm to about 500 sccm.

3. The method of claim 1, wherein maintaining the substrate assembly surface at a temperature includes maintaining the substrate assembly surface at a temperature in the range of about 150° C. to about 250° C.

4. The method of claim 1, wherein the rough ruthenium layer is deposited at a rate of about 100 Å/minute to about 500 Å/minute.

5. The method of claim 4, wherein the rough ruthenium layer is deposited at a rate of about 200 Å/minute to about 300 Å/minute.

6. The method of claim 4, wherein the RMS roughness of the rough ruthenium layer is in a range of about 50 Å to about 600 Å.

7. The method of claim 4, wherein a nominal center cross-section area of grains at a surface of the rough ruthenium layer is in a range of about 100 Å to about 800 Å.

8. The method of claim 1, wherein the method further includes annealing the rough ruthenium layer at a temperature in a range of about 300° C. to about 900° C. for a time period in a range of about 30 seconds to about 30 minutes.

9. The method of claim 8, wherein annealing the rough ruthenium layer further includes annealing the rough ruthenium layer at a pressure in a range of about 0.1 millitorr to about 5 atmospheres in a gas atmosphere subjected to a glow discharge created by applying an electromagnetic field across the gas mixture.

10. The method of claim 9, wherein the gas atmosphere is selected from one of oxygen, ozone, nitrogen, argon or a combination thereof, and further wherein the glow discharge is created by applying a radio frequency electromagnetic field of 13.56 megahertz at a power density of 0 to about 5 kW/cm$^2$ across the gas atmosphere.

11. A method for forming a rough conductive layer in the fabrication of integrated circuits, the method comprising:

providing a substrate assembly in a reaction chamber, the substrate assembly including a surface;

providing a ruthenium-containing precursor into the reaction chamber;

depositing a rough ruthenium layer on the surface of the substrate assembly at a rate of about 100 Å/minute to about 500 Å/minute.

12. The method of claim 11, wherein the rough ruthenium layer is deposited at a rate of about 200 Å/minute to about 300 Å/minute.

13. The method of claim 11, wherein providing a ruthenium-containing precursor into the reaction chamber includes providing a carrier gas at a flow rate of about 100 sccm to about 500 sccm through the ruthenium-containing precursor maintained at a temperature of about 15° C. to about 100° C. and into the reaction chamber to deposit the rough ruthenium layer on the surface of the substrate assembly.

14. The method of claim 11, wherein the method further includes maintaining the substrate assembly surface at a temperature in a range of about 100° C. to about 400° C.

15. The method of claim 11, wherein the method further includes maintaining the pressure of the reaction chamber in a range of about 0.4 torr to about 10 torr.

16. The method of claim 11, wherein the method further includes annealing the rough ruthenium layer at a temperature in a range of about 300° C. to about 900° C. for a time period in a range of about 30 seconds to about 30 minutes.

17. The method of claim 16 wherein annealing the rough ruthenium layer further includes annealing the rough ruthenium layer at a pressure in a range of about 0.1 millitorr to about 5 atmospheres in a gas atmosphere subjected to a glow discharge created by applying an electromagnetic field across the gas mixture.

18. The method of claim 11, wherein providing the substrate assembly surface includes providing non-rough ruthenium, the rough layer of ruthenium formed on the non-rough ruthenium.

19. The method of claim 11, wherein providing the substrate assembly surface includes providing non-rough ruthenium oxide, the rough layer of ruthenium formed on the non-rough ruthenium oxide.

20. A method for forming a rough conductive layer in the fabrication of integrated circuits, the method comprising:

providing a substrate assembly in a reaction chamber, the substrate assembly including a surface;

providing a ruthenium-containing precursor into the reaction chamber;

providing an oxygen-containing precursor into the reaction chamber; and depositing a rough ruthenium oxide layer on the surface of the substrate assembly at a rate of about 100 Å/minute to about 1200 Å/minute, wherein the RMS roughness of the rough ruthenium oxide layer is in a range of about 50 Å to about 600 Å.

21. The method of claim 20, wherein the rough ruthenium oxide layer is deposited at a rate of about 300 Å/minute to about 600 Å/minute.

22. The method of claim 21, wherein the method further includes maintaining the pressure of the reaction chamber in a range of about 0.4 torr to about 100 torr.

23. The method of claim 20, wherein providing a ruthenium-containing precursor into the reaction chamber includes providing a carrier gas at a flow rate of about 100 sccm to about 500 sccm through the ruthenium-containing precursor maintained at a temperature of about 15° C. to about 100° C. and into the reaction chamber, and further wherein providing the oxygen-containing precursor into the reaction chamber includes providing an oxygen-containing precursor into the reaction chamber at a flow rate of about 100 sccm to about 2000 sccm.

24. The method of claim 23, wherein the method further includes maintaining the substrate assembly surface at a temperature in a range of about 100° C. to about 400° C.

25. The method of claim 20, wherein providing the substrate assembly surface includes providing non-rough ruthenium, the rough layer of ruthenium oxide is formed on the non-rough ruthenium.

26. A method for forming a rough conductive layer in the fabrication of integrated circuits, the method comprising:

providing a substrate assembly in a reaction chamber, the substrate assembly including a surface;

providing a ruthenium-containing precursor into the reaction chamber;

providing an oxygen-containing precursor into the reaction chamber; and depositing a rough ruthenium oxide layer on the surface of the substrate assembly at a rate of about 100 Å/minute to about 1200 Å/minute, wherein a nominal center cross-section area of grains at a surface of the rough ruthenium oxide layer is in a range of about 100 Å to about 800 Å.

27. The method of claim 26, wherein the rough ruthenium oxide layer is deposited at a rate of about 300 Å/minute to about 600 Å/minute.

28. The method of claim 27, wherein the method further includes maintaining the pressure of the reaction chamber in a range of about 0.4 torr to about 100 torr.

29. The method of claim 26, wherein providing a ruthenium-containing precursor into the reaction chamber includes providing a carrier gas at a flow rate of about 100 sccm to about 500 sccm through the ruthenium-containing precursor maintained at a temperature of about 15° C. to about 100° C. and into the reaction chamber, and further wherein providing the oxygen-containing precursor into the reaction chamber includes providing an oxygen-containing precursor into the reaction chamber at a flow rate of about 100 sccm to about 2000 sccm.

30. The method of claim 29, wherein the method further includes maintaining the substrate assembly surface at a temperature in a range of about 100° C. to about 400° C.

31. The method of claim 26, wherein providing the substrate assembly surface includes providing non-rough ruthenium, the rough layer of ruthenium oxide is formed on the non-rough ruthenium.

32. A method for forming a rough conductive layer in the fabrication of integrated circuits, the method comprising:

providing a substrate assembly in a reaction chamber, the substrate assembly including a surface;

providing a ruthenium-containing precursor into the reaction chamber;

providing an oxygen-containing precursor into the reaction chamber; and depositing a rough ruthenium oxide layer on the surface of the substrate assembly at a rate of about 100 Å/minute to about 1200 Å/minute, wherein the method further includes annealing the rough ruthenium oxide layer at a temperature in a range of about 300° C. to about 900° C. for a time period in a range of about 30 seconds to about 30 minutes in a gas atmosphere subjected to a glow discharge created by applying an electromagnetic field across the gas.

33. The method of claim 32, wherein the rough ruthenium oxide layer is deposited at a rate of about 300 Å/minute to about 600 Å/minute.

34. The method of claim 33, wherein providing a ruthenium-containing precursor into the reaction chamber includes providing a carrier gas at a flow rate of about 100 sccm to about 500 sccm through the ruthenium-containing precursor maintained at a temperature of about 15° C. to about 100° C. and into the reaction chamber, and further wherein providing the oxygen-containing precursor into the reaction chamber includes providing an oxygen-containing precursor into the reaction chamber at a flow rate of about 100 sccm to about 2000 sccm.

35. The method of claim 32, wherein providing a ruthenium-containing precursor into the reaction chamber includes providing a carrier gas at a flow rate of about 100 sccm to about 500 sccm through the ruthenium-containing precursor maintained at a temperature of about 15° C. to about 100° C. and into the reaction chamber, and further wherein providing the oxygen-containing precursor into the reaction chamber includes providing an oxygen-containing precursor into the reaction chamber at a flow rate of about 100 sccm to about 2000 sccm.

36. The method of claim 35, wherein the method further includes maintaining the substrate assembly surface at a temperature in a range of about 100° C. to about 400° C.

37. The method of claim 32, wherein annealing the rough ruthenium oxide layer further includes annealing the rough ruthenium oxide layer at a pressure in a range of about 0.1 millitorr to about 5 atmospheres.

38. The method of claim 32, wherein providing the substrate assembly surface includes providing non-rough ruthenium, the rough layer of ruthenium oxide is formed on the non-rough ruthenium.

* * * * *

UNITED STATES PATENT AND TRADEMARK OFFICE
CERTIFICATE OF CORRECTION

PATENT NO. : 6,429,127 B1  
DATED : August 6, 2002  
INVENTOR(S) : Derderian et al.

It is certified that error appears in the above-identified patent and that said Letters Patent is hereby corrected as shown below:

<u>Column 18,</u>
Lines 10-19, delete "The method of claim 33, wherein providing a ruthenium-containing precursor into the reaction chamber includes providing a carrier gas at a flow rate of about 100 sccm to about 500 sccm through the ruthenium-containing precursor maintained at a temperature of about 15º C. to about 100º C. and into the reaction chamber, and further wherein providing the oxygen-containing precursor into the reaction chamber includes providing an oxygen-containing precursor into the reaction chamber at a flow rate of about 100 sccm to about 2000 sccm." and insert -- "The method of claim 33, wherein the method further includes maintaining the pressure of the reaction chamber in a range of about 0.4 torr about 100 torr." --.

Signed and Sealed this

Nineteenth Day of November, 2002

Attest:

Attesting Officer

JAMES E. ROGAN  
*Director of the United States Patent and Trademark Office*